United States Patent [19]

Baums et al.

[11] Patent Number: 5,325,387
[45] Date of Patent: Jun. 28, 1994

[54] METHOD OF OPERATING A SEMICONDUCTOR LASER AS A BISTABLE OPTO-ELECTRONIC COMPONENT

[75] Inventors: Dieter Baums, Ludwigsburg; Michael Schilling, Stuttgart; Wilfried Idler, Asperg; Gert Laube, Stuttgart; Klaus Wünstel, Schwieberdingen; Olaf Hildebrand, Stuttgart, all of Fed. Rep. of Germany

[73] Assignee: Alcatel N.V., Amsterdam, Netherlands

[21] Appl. No.: 980,958

[22] Filed: Nov. 24, 1992

[30] Foreign Application Priority Data

Dec. 2, 1991 [DE] Fed. Rep. of Germany ....... 4139663

[51] Int. Cl.$^5$ ............................................... H01S 3/10
[52] U.S. Cl. ......................................... 372/50; 372/23; 372/46; 359/132
[58] Field of Search .................... 372/23, 3, 46, 47, 48, 372/50; 359/124, 127, 132, 133

[56] References Cited

U.S. PATENT DOCUMENTS

| | | | |
|---|---|---|---|
| 4,007,978 | 2/1977 | Holton | 385/14 |
| 4,719,634 | 1/1988 | Streifer et al. | 372/46 |
| 5,098,804 | 3/1992 | Booth | 430/1 |
| 5,105,433 | 4/1992 | Eisele et al. | 372/50 |
| 5,109,444 | 4/1992 | Handa et al. | 385/14 |
| 5,214,664 | 5/1993 | Paoli | 372/46 |

FOREIGN PATENT DOCUMENTS 0418705  3/1991  European Pat. Off. .

OTHER PUBLICATIONS

Hildebrand et al., "The Integrated Interferometric Injection Laser (Y-Laser)": One Device Concept for Various System Applications, 17th European Conference on Optical Communication ECOC 1991, and 8th International Conference on Integrated Optics and Optical Fibre Communication IOOC 1991, pp. 39–46.

Shoji et al., "Fast Bistable Wavelength Switching Characteristics in Two-Electrode Distributed Feedback Laser" IEEE Photonics Technology Letters, vol. 2, No. 2, Feb. 1990, pp. 109–110.

Schilling et al., "Integrated Interferometric Injection Laser: Novel Fast and Broad-Band Tunable Monolithic Light Source," IEEE Journal of Quantum Electronics, vol. 27, No. 6, Jun. 1991, pp. 1616–1623.

Idler et al., "High Speed Integrated Interferometric Injection Laser with 22 nm Tuning Range," 16th European Conference on Optical Communication ECOC 1990, vol. 1, Regular Papers, pp. 479–482.

Henning et al., "Electrical Tuning of Semiconductor Interoferometric Laser," Electronics Letters, vol. 19, No. 22, Oct. 1983, pp. 926 and 929.

Electronics Letters, Feb. 15th, 1990, vol. 26, No. 4; "Widely Tunable Y-Coupled . . . ".

IEEE Photonics Technology Letters, vol. 2, No. 9, Sep. 1990; M. Kuznetsov: "Picosecond Switching Dynamics . . . ".

Appl. Phys. Lett. 39(10), Nov. 15th, 1981; W. T. Tsang: "Extremely Low Threshold . . . ".

Appl. Phys. Lett. 51(10), Mar. 7th, 1988; J. Salzman et al.: "Cross Coupled Cavity . . . ".

*Primary Examiner*—Frank Gonzalez
*Attorney, Agent, or Firm*—Spencer, Frank & Schneider

[57] ABSTRACT

A semiconductor laser is provided monolithically integrated on a substrate and has a cavity layer extending above a plane that is coplanar with a base surface of the substrate, is branched and includes a plurality of separately controllable regions. The laser is operated by changing charge carrier density in at least one of the regions so that it emits light at one of a first wavelength and a second wavelength in correspondence with the charge carrier density change.

10 Claims, 2 Drawing Sheets

METHOD OF OPERATING A SEMICONDUCTOR LASER AS A BISTABLE OPTO-ELECTRONIC COMPONENT

CROSS REFERENCE TO RELATED APPLICATION

This application claims the priority of Application Ser. No. P 41 39 663.4, filed Dec. 2, 1991, in the Federal Republic of Germany, the subject matter of which is incorporated herein by reference.

BACKGROUND OF THE INVENTION

The present invention is based on a semiconductor laser having a branched cavity layer.

Such a semiconductor laser is disclosed in Electronics Letters, Feb. 15, 1990, Vol. 26, No. 4, pages 243-244. It is monolithically integrated on an n-doped indium phosphide substrate. The underside of the substrate is called the base surface. Above a plane that is coplanar with the base surface, there extends a cavity layer of indium gallium arsenide phosphide (InGaAsP). It is branched and, when seen from the top, has the shape of a "Y". The top view surface of the cavity layer may also have a different shape, for example the shape of a cross. Significant is that the cavity layer is contiguous. This can be described in the sense of a topological definition in that the top view surface of the cavity layer can be considered to be a "singly contiguous region" since it is not composed of several pieces, but of a single piece having a single edge. The cavity layer lies on the planar surface of an n-doped buffer layer of indium phosphide that extends above the indium phosphide substrate.

Further layers are provided above the cavity layer. Above the buffer layer, these layers and the cavity layer form a mesa which has been produced by etching. In the plane that is coplanar with the base surface, the mesa as well as the cavity layer have a Y shape.

Such a laser with a branched cavity layer is provided according to the above-mentioned publication as an electrically controllable light source for optical communications transmission systems. In particular, if its metal layer extending above the cavity layer is subdivided into several electrodes so that cavity layer regions are created which can be controlled by means of different operating currents, such a laser is distinguished by its emission wavelength being tunable over a very wide wavelength range. This characteristic is of major importance for use as an electrically controllable light source as advocated in the publication.

Bistable components are gaining increasing significance for optical transmission. "Bistable" here means that, if actuated in the same manner, that is, with the same current or the same voltage, the component may assume two different states, that is, it emits light of a low or high intensity or light of a first wavelength or light of a second wavelength, depending on the manner in which the actuation state under observation has been realized.

Bistable components are suitable for use as optical switches or memories in wavelength multiplex switching systems and in optical data processing systems.

The publication IEEE Photonics Technology Letters, Vol. 2, No. 9, September 1990, pages 623-625, discloses a DFB [distributed feedback] semiconductor laser composed of two segments and operated as a wavelength bistable memory. It can be set and reset within 450 picoseconds by means of electrical pulses. The DFB semiconductor laser in each case emits light at one of two wavelengths which are spaced from one another by 0.9 nm.

SUMMARY OF THE INVENTION

It is an object of the present invention to provide a method with which semiconductor lasers equipped with a branched cavity layer can be employed as optical switches and memories.

This is accomplished by changing charge carrier density in at least one separately controllable region.

Modifications are disclosed in the dependent claims.

In the novel operating mode as a wavelength bistable component, the semiconductor laser can be employed, for example, as a multiplexer or demultiplexer component or as an optical sample and hold member.

BRIEF DESCRIPTION OF THE DRAWINGS

The invention will now be described in greater detail with reference to embodiments thereof that are illustrated in the drawings in which.

DETAILED DESCRIPTION OF THE PREFERRED EMBODIMENTS

Figure 1:
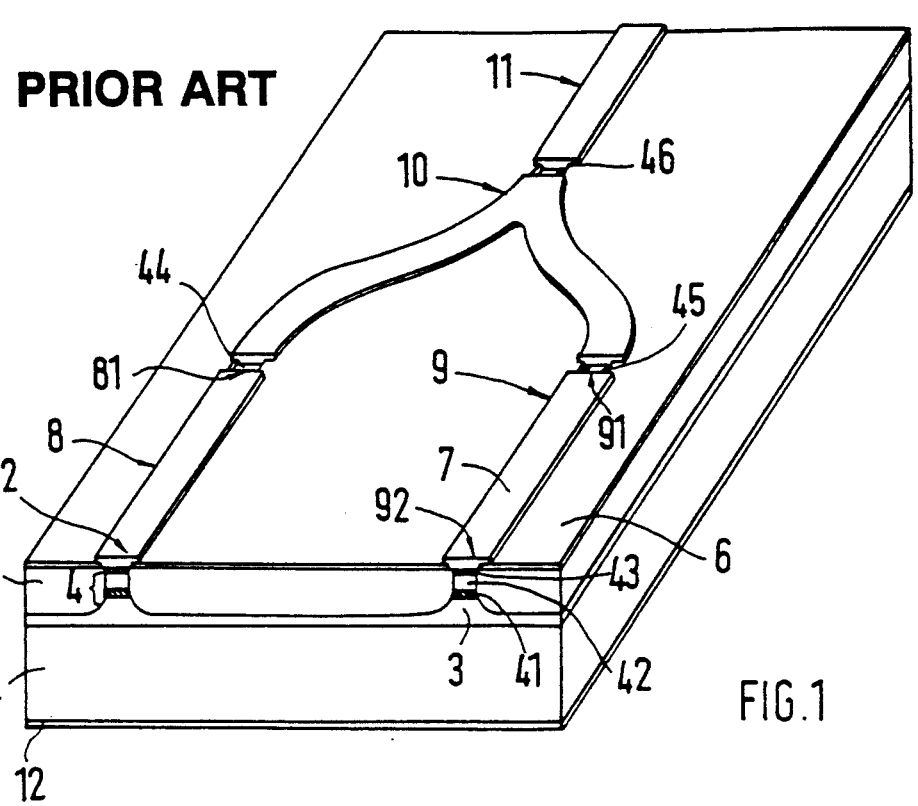
FIG. 1 depicts a prior art semiconductor laser equipped with a branched cavity layer.

FIG. 1 shows a prior art semiconductor laser that is equipped with a branched cavity layer.

It includes a substrate 2 of n-doped indium phosphide. Above it lies a buffer layer 3 likewise composed of n-doped indium phosphide. Part of the buffer layer forms the lowermost layer of a mesa 4 which, when seen from the top, has the shape of a Y. Mesa 4 has several layers. It includes a cavity layer 41 of indium gallium arsenide phosphide. This cavity layer is covered by a covering layer 42 of p doped indium phosphide. Above it lies a contact layer 43 of p+ doped indium gallium arsenide. On the side of mesa 4 and above the surface of buffer layer 3 where it is not covered by layer 41, a layer of semi-insulating indium phosphide 5 is provided in order to provide electrical insulation and optical wave guidance in mesa 4. The upper surface of this layer 5 forms a plane with the upper surface of contact layer 43. Layer 5 is covered by a protective layer 6 of silicon dioxide, contact layer 43 is covered by a metal layer 7.

Three troughs 44, 45 and 46 are etched into metal layer 7 and mesa 4, dividing the laser into four regions 8, 9, 10 and 11. According to the illustration in FIG. 1, troughs 44, 45 and 46 may also extend into covering layer 42, but not into cavity layer 41, depending on the optical coupling intended to be established between regions 8 to 11. In each one of regions 8 to 11, metal layer 7 forms a first electrode. A second electrode is formed in each region 8 to 11 by a metal layer 12 that is applied underneath substrate 2. During operation of semiconductor laser 1, a current that can be fixedly set or varied in each case flows from the metal layer 7 of each one of regions 8 to 11 through the respective region 8 to 11 to metal layer 12 which serves as ground contact. This direction of current flow should be considered as the forward direction of the respective region of the laser.

Cavity layer 41 may have a quantum well layer structure in its cross section, as disclosed, for example, in Appl. Phys. Lett. Vol. 39 (10), Nov. 15, 1981, pages 786–788. Or it may have a different layer structure. The layer structure is not significant for the present invention.

If the cavity layer 41 of semiconductor laser 1 has the composition $In_{0.62}Ga_{0.38}As_{0.82}P_{0.18}$, the semiconductor emits light in a wavelength range around 1520 nm.

If cavity layer 41 has a composition $In_{0.57}Ga_{0.43}As_{0.73}P_{0.27}$, the semiconductor emits light in a wavelength range around 1300 nm. In both cases, the wavelength range can be tuned to at least ±20 nm by varying the operating current.

Semiconductor laser 1 may also be constructed as a GaAlAs/GaAs semiconductor laser; such a structure is disclosed, for example, in Appl. Phys. Lett., Vol. 52, No. 10, Mar. 7, 1988, pages 767–769.

Mesa 4 and thus cavity layer 41 may be constructed not only in the form of a "Y" as shown in FIG. 1 but, for example, also in the shape of a cross, as it is also disclosed in that publication.

For each one of regions 8 to 11, it is possible to define a transparency current and a laser threshold current in that each region can be considered to be an individual Fabry-Pérot laser that could be operated independently of the other regions. The transparency current is understood to mean the current required to make the region transparent for light of the wavelength that it would emit itself if it were in the laser active state. The laser threshold current is understood to mean the current flowing through the region under observation at which the region becomes laser active and emits coherent light.

The term light is here and hereinafter understood to mean any optical radiation even if its wavelength lies outside of the visible range.

A first example of the novel method for operating the semiconductor laser shown in FIG. 1 will now be described.

Region 11 of the semiconductor laser is operated above its laser threshold current, that is, a current of, for example, 60 mA flows through it.

The currents flowing through regions 8 and 9 have a current intensity between, for example, 10 and 40 mA; thus, the regions are transparent. For switching purposes it is sufficient if, at certain times, only one of regions 8 and 9 is transparent.

For example, a current that lies between a current $I_1=4$ mA and a current $I_5=25$ mA flows through region 10.

Figure 2:
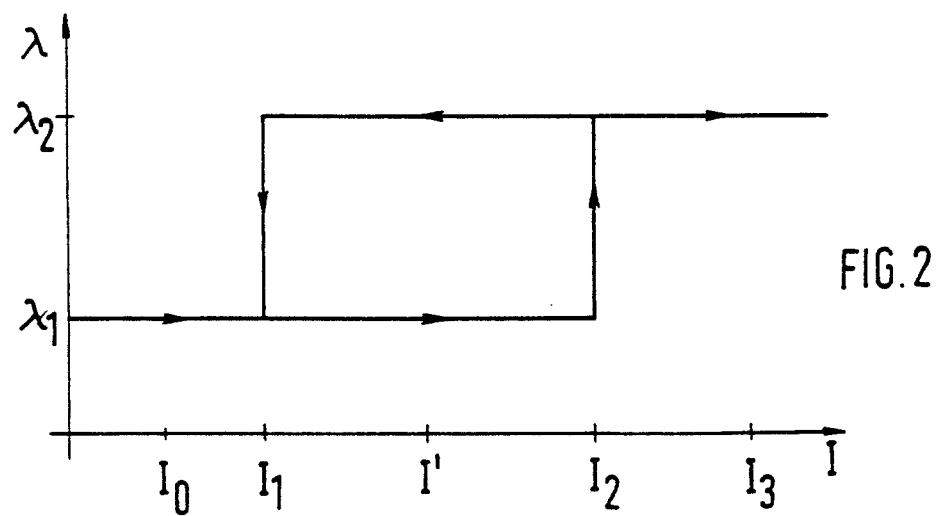
FIG. 2 depicts the wavelength of the light signal emitted by the semiconductor laser as a function of the current flowing through one of its regions.

FIG. 2 shows how, in the above-described operating mode of the semiconductor laser, the emission wavelength of the semiconductor laser of FIG. 1 varies as a function of a current I flowing through region 10. If the current intensity is varied, beginning with a current intensity of $I_0$ which lies below $I_1$, in that it is permitted to rise, the wavelength $\lambda_1$ of the light emitted by semiconductor laser 1, as shown in FIG. 2, changes suddenly to a wavelength $\lambda_2$ at a current intensity $I_2$ which lies between 20 and 25 mA. $I_2$ will hereinafter be called the "upper current threshold". If one now reduces the current intensity in the reverse direction, for example, beginning with a current intensity $I_3$ that lies above $I_2$, the wavelength $\lambda$ remains equal to wavelength $\lambda_2$ even below $I_2$ and changes to wavelength $\lambda_1$ only after the current intensity falls below a lower current threshold $I_1$ which lies, for example, at 4 mA.

Thus, between the lower current threshold $I_1$ and the upper current threshold $I_2$, the emission wavelength of the semiconductor laser may have two different values, depending on which starting value and which rise are used to change the current intensity of the current flowing through region 10. The curve of FIG. 2 thus shows the hysteresis behavior of a state typical for bistable components as a function of a control value, with the state here being the emission wavelength and the control value being the current I flowing through region 10.

If, thus, an electrical signal, whose current intensity is at least 4 mA, rises to a value of 25 mA or more and then drops again to a value of 4 mA, is applied to region 10, the semiconductor laser will alternatingly generate light of wavelength $\lambda_1$ or $\lambda_2$.

Wavelength $\lambda_1$ is, for example, 1559 nm, wavelength $\lambda_2$ is 1565 nm, that is, a wavelength difference of several nanometers can be realized.

Physically, the change in wavelengths that can be realized in the above-described operating mode is based on a change in the effective refractive index for the laser modes propagating in the branching region of the cavity layer. The wavelength bistability is thus based on a dispersive effect caused by the change in the current.

As an alternative to the above-described operating mode, the semiconductor laser can also be operated as follows.

An operating current lying above the laser threshold current is permitted to flow through region 11 so that region 11 becomes laser active. An operating current which causes the respective region to act as a saturable absorber for light generated in region 11 is permitted to flow through one of regions 8, 9 or 10, while the other two regions of regions 8, 9 and 10 are supplied with such an operating current that makes them transparent for the light generated in region 11. A region acts as a saturable absorber if a voltage is applied across it that is directed opposite to the forward direction or at least no current flows through it in the forward direction. For example, region 10 is operated as a saturable absorber by way of a fixed bias while simultaneously regions 8 and 9 are operated by means of suitable fixed currents so that they are in the transparency state. If the current flowing through region 11 is now varied, this changes the absorption state of saturable absorber 10 and thus the effective resonator length, which ultimately changes the wavelength of the emitted light. This change of the wavelength of the emitted light also exhibits hysteresis behavior so that a wavelength bistable operating mode corresponding to the wavelength behavior shown in FIG. 3 results. This type of wavelength bistability is called absorptive bistability.

In this operating mode, the changed absorption state of the saturable absorber causes the intensity of the emitted light to be changed simultaneously with the wavelength. The change in intensity here occurs analogously to the wavelength change shown in FIG. 2. Because of the new operating mode, component 10 can also be employed as a bistable-intensity opto-electronic component.

Regardless of whether the resulting bistability is a dispersive bistability, as in the first described operating mode, or an absorptive bistability as in the second described operating mode, both operating modes have the following in common: in one of the semiconductor regions (in the first case in region 10 and in the second case in region 11) a change in current changes the charge carrier density in such a way that the semiconductor laser emits light at a first wavelength or at a second wavelength.

A multitude of practical applications are conceivable in which it would be useful to operate the semiconductor laser of FIG. 1 according to the method of the invention as a bistable opto-electronic component.

For example, the semiconductor laser according to the present invention may be used as a component in a demultiplexer. If, for example, two electrical signals S' and S" are multiplexed with one another and each one of the two signals S' and S" is given an address at the start, as this is the case, for example, in digital signals that are transmitted in packets, with each packet being preceded by an address that determines the destination of the data packet, the two digital signals could initially be converted in such a way that their current fluctuates within current thresholds $I_1$ and $I_2$ and the addresses preceding the digital signals can be replaced by a short current pulse which, in the case of an address preceding a signal, has a current intensity $I_0$, that is, a current pulse which falls below the lower current threshold $I_1$, and the address preceding the second digital signal can be replaced by a current pulse of current intensity $I_3$, that is, a current pulse which exceeds the upper current threshold $I_2$. If now an electrical multiplex signal that is modified in this manner is used to actuate region 10 of the semiconductor laser according to the first operating mode described above, the semiconductor laser emits a corresponding optical multiplex signal, with the signal S' contained therein having the wavelength $\lambda_1$ and the signal S" contained therein having the wavelength $\lambda_2$. Because of their different wavelengths, both signals can now be separated from one another by optical means.

Another aspect of this operating mode is that the semiconductor component is employed as an electrical-optical transducer, with the wavelength of the resulting optical signal being controllable by a control pulse which precedes the electrical signal that modulates the changeable current.

Conversely, the semiconductor laser can also be employed according to the method of the invention in such a way that it acts as a multiplexer component. The signals to be multiplexed are then modified in such a way that their current intensity fluctuates between $I_1$ and $I_2$ and one signal is preceded by a control pulse that falls below $I_1$ while the other signal is preceded by a control pulse that exceeds $I_2$. If one now actuates the region 10 of a semiconductor laser according to FIG. 1 with the one signal and the region 10 of a second corresponding semiconductor laser with the other signal, the first electrical signal is converted into a light signal at wavelength $\lambda_1$ and the second electrical signal is converted into a light signal at wavelength $\lambda_2$. Both light signals can then be transmitted in wavelength multiplex over one optical waveguide.

Since there thus exists the option to control, by means of a suitable control pulse, whether the light signal has the wavelength $\lambda_1$ or the wavelength $\lambda_2$, it is also possible to control whether an optical switching element, that is able to emit light at a first wavelength at another output than light at a second wavelength, is to emit a signal S' or a signal S" at a certain output.

A third embodiment of the method according to the invention will now be described. In the above described embodiments, the charge carriers required for laser operation were generated solely by current injection into one of regions 8 to 11. Instead it is also possible to control the change in charge carriers in the region that produces bistable wavelength exclusively by the influx of light into at least one of the regions 8, 9 or 11, with the light having a higher energy than the light emitted by the semiconductor laser. It is also possible to control the changes in the charge carriers in a region partially by current injection and partially by light radiation. For example, light at a wavelength of 800, 1300 or 1530 nm can be radiated into a semiconductor laser which emits light at a wavelength of 1560 nm. The light to be radiated in itself may again be generated by a semiconductor laser.

A useful application will now be described for a change in charge carriers that can be controlled by current injection and by the simultaneous radiation of light. In this case, a current flows through region 10, for example, whose intensity alternates between current intensity $I_0$ (see FIG. 2) and current intensity I', where I' is just greater than the lower current threshold I but smaller than the upper current threshold $I_2$. The top line of FIG. 3 shows such a current curve which, as will be described below, serves as the clock pulse.

A light signal at a wavelength of $\lambda_0$ is radiated as data signal D into one of regions 11, 8 or 9, for example into region 11. Wavelength $\lambda_0$ is shorter than wavelengths $\lambda_1$ and $\lambda_2$ so that it permits the generation of charge carriers in region 10. The light signal representing a data signal D is intensity modulated so that it alternates, corresponding to the data signal it represents, between a high intensity and a lower intensity (e.g., intensity 0).

The higher intensity of the light signal is selected in such a way that the number of charge carriers produced by it in region 10 is lower than the number resulting if the charge carriers are produced solely by a current flowing through region 10, with the current intensity of the current flowing through region 10 lying above $I_2$, for example, at $I_3$. The higher intensity of the light signal is thus not sufficient to bring the semiconductor laser into the state in which its emitted light has the wavelength $\lambda_2$. If, however, together with such an influx of light, region 10 encounters a current that has an intensity I' (FIG. 2) between $I_1$ and $I_2$ and thus would be insufficient on its own to bring the semiconductor laser into the state of an emission wavelength $\lambda_2$, the joint action of light and current brings the semiconductor laser into this state.

Figure 3:
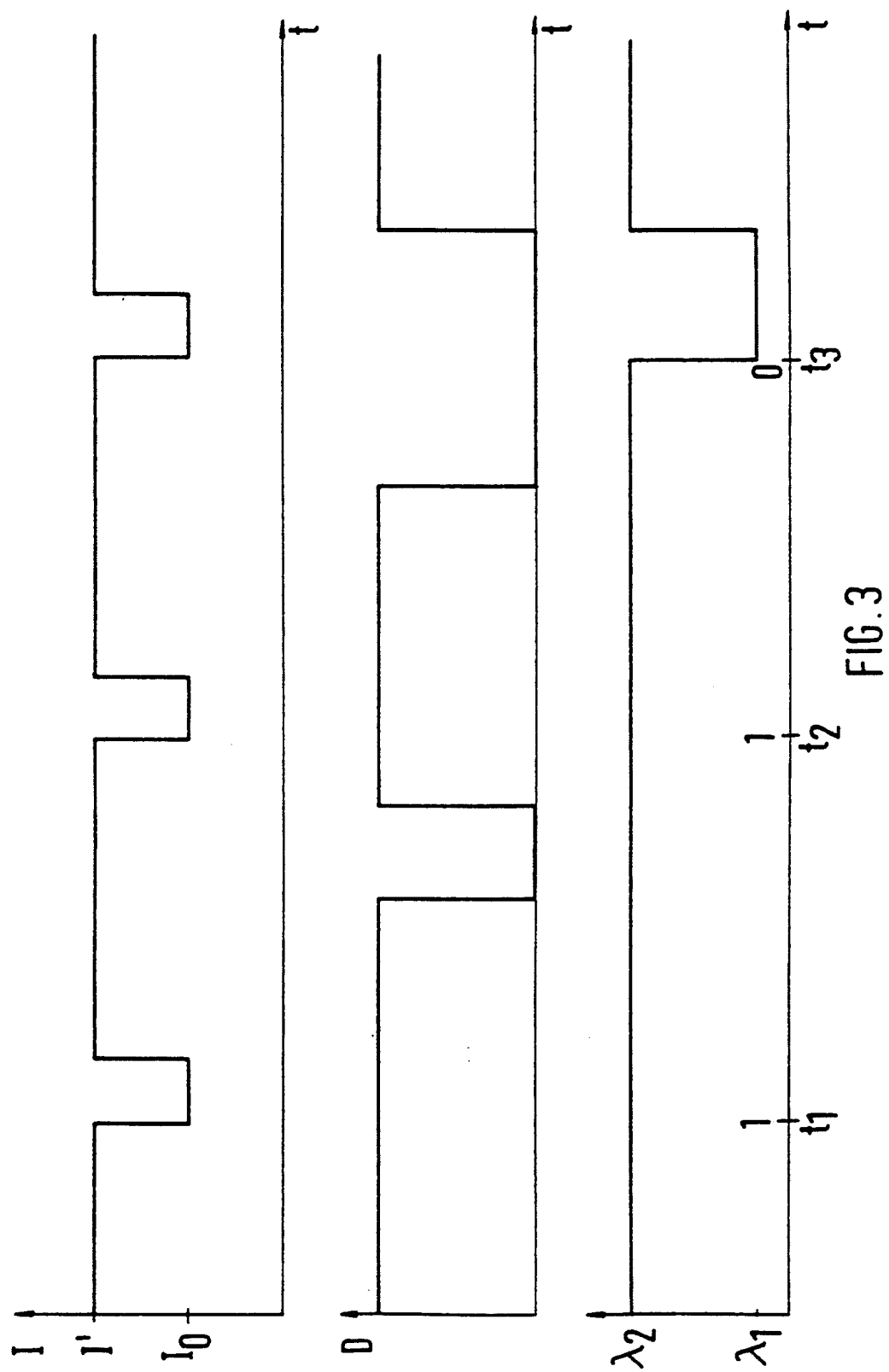
FIG. 3 is a clock pulse diagram to explain an application in which the semiconductor laser is controlled electrically and optically.

Thus, for the described application, a current I of the alternating current intensities $I_0$ and I' shown in FIG. 3 is caused to flow through region 10 as a clock pulse and a light signal D is introduced into region 11, while the remaining conditions are as follows: a fixed pre-conduction current causes region 11 to be operated in the laser active state while regions 8 and 9 are operated in the transparency state, likewise by way of fixed operating currents.

Under these conditions, the semiconductor laser emits light at wavelength $\lambda_2$ from regions 8 and 9 so long as the light signal does not have the low intensity and the clock signal the current intensity $I_0$. In the example shown in FIG. 3, the emission wavelength thus changes at the point in time $t_3$ given on the time axis, since at this point in time not only does the light signal have the low intensity but the current I also goes back to its lower value $I_0$. The emission wavelength will jump back to wavelength $\lambda_2$ only if the light signal has the higher intensity again and the current I has the higher current intensity I'.

If one assigns the logic value 1 to data signal D in FIG. 3 if the light intensity of the optical signal representing it has the higher value and the logic value 0 if the light intensity has the lower value, and if one assigns the logic value 1 to the emitted light signal if its wavelength equals $\lambda_2$ and the logic value 0 if its wavelength equals $\lambda_1$, the following becomes evident from FIG. 3. At times $t_1$, $t_2$ and $t_3$, at which current I, that is the clock pulse, has a negative edge, the emitted light signal has the same logic value as the data signal, namely the logic value 1 at $t_1$, the logic value 1 at $t_2$, and the logic value 0 at $t_3$. If one considers times $t_1$, $t_2$ and $t_3$ as the sampling moments for the data signal as determined by the clock pulse, the semiconductor laser operated according to the above-described method can be considered to be a sample and hold member for a data signal present in the form of an optical signal. The hold time is here at least as long as the width of the clock pulses, since the emission wavelength is able to jump back from $\lambda_1$ to $\lambda_2$ no earlier than with the positive clock pulse edge of current I.

It is of course also possible to employ the data signal as a control current for region 10 and to employ a clock pulse in the form of a correspondingly intensity modulated light signal that is conducted into region 11. In this case, an electrical data signal would be sampled by a succession of optical clock pulses. In both cases, an optical signal appears at the output whose wavelength at the sampling times marked by the clock pulse has a logic value that corresponds to the data signal.

It will be understood that the above description of the present invention is susceptible to various modifications, changes and adaptations, and the same are intended to be comprehended within the meaning and range of equivalents of the appended claims.

What is claimed is:

1. A method comprising:
   providing a semiconductor laser that is monolithically integrated on a substrate and has a cavity layer extending above a plane that is coplanar with a base surface of the substrate, is branched and includes a plurality of separately controllable regions; and
   changing charge carrier density in a single one of the regions so that the semiconductor laser is bistable with respect to the wavelength of emitted light wherein the laser emits light at one of a first wavelength and a second wavelength in correspondence with the charge carrier density change in said single one of the regions.

2. A method according to claim 1, wherein at least one of a plurality of currents flowing through the regions is changed.

3. A method according to claim 1, wherein a light signal of a higher energy than a light signal emitted by the semiconductor laser is introduced into at least one of the regions.

4. A method according to claim 1, wherein at least one of a plurality of currents flowing through the regions is changed and a light signal having a higher energy than a light signal emitted by the semiconductor laser is introduced into at least one of the regions.

5. A method according to claim 2, wherein a current that is changed in said single one of the regions is modulated by a signal that first produces a current intensity at which the semiconductor laser unequivocally emits light at one of the first wavelength and the second wavelengths, and subsequently produces a current intensity at which the semiconductor laser changes to the respective other of the first and second wavelengths, whereby the signal produces currents at which the semiconductor laser exhibits wavelength bistability.

6. A method according to claim 4, wherein the current that is changed in said single one of the regions is modulated by a succession of clock pulses and the light signal introduced into one of the regions represents a data signal.

7. A method according to claim 1, wherein the charge carrier density is changed in said single one of the regions so that in addition to the wavelength of the emitted light, the intensity also changes whereby the semiconductor laser emits light at one of a low intensity and a high intensity.

8. A method according to claim 4, wherein the current that is changed in said single one of the regions is modulated by a data signal and the light signal introduced into one of the regions represents a succession of clock pulses.

9. An optical signal wavelength multiplexing method comprising:
   providing first and second semiconductor lasers, outputs thereof being coupled to a single optical waveguide, each laser being monolithically integrated on a substrate and having a cavity layer extending above a plane that is copolanar with a base surface of the substrate, is branched and includes one controllable region; and
   selectively providing charge carrier density at a first level in a single controllable region of the first laser and at a second level in a single controllable region of the second laser so that the lasers output light to the waveguide at one of a first and a second wavelength, respectively, in correspondence with the charge carrier density.

10. The method of claim 9, wherein the step of selectively providing charge carrier density comprises:
    providing first and second information signals having current intensities which fluctuate between first and second values to the respective first and second lasers; and
    preceding the first information signal with a control signal which is below the first current intensity value, and preceding the second information signal with a control signal which exceeds the second current intensity value;
    whereby the first laser produces a light signal at the first wavelength and the second laser produces a light signal at the second wavelength.

* * * * *